United States Patent
Fujii et al.

(10) Patent No.: US 8,981,522 B2
(45) Date of Patent: Mar. 17, 2015

(54) NONVOLATILE SEMICONDUCTOR STORAGE DEVICE AND METHOD OF MANUFACTURING THE SAME

(71) Applicant: Kabushiki Kaisha Toshiba, Minato-ku (JP)

(72) Inventors: Kenichi Fujii, Yokkaichi (JP); Akira Yotsumoto, Yokkaichi (JP); Takaya Yamanaka, Yokkaichi (JP); Fumie Kikushima, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/010,662

(22) Filed: Aug. 27, 2013

(65) Prior Publication Data

US 2014/0197473 A1 Jul. 17, 2014

(30) Foreign Application Priority Data

Jan. 17, 2013 (JP) .................... 2013-006328

(51) Int. Cl.

| H01L 29/00 | (2006.01) |
|---|---|
| H01L 21/762 | (2006.01) |
| G11C 16/00 | (2006.01) |
| H01L 29/66 | (2006.01) |
| H01L 27/115 | (2006.01) |

(52) U.S. Cl.
CPC .......... H01L 21/76224 (2013.01); G11C 16/00 (2013.01); H01L 29/66825 (2013.01); H01L 27/11524 (2013.01)
USPC .............. 257/524; 257/315; 257/E29.018

(58) Field of Classification Search
USPC ......... 257/314, 315, 374, 499, 501, 523, 524, 257/E29.018
See application file for complete search history.

(56) References Cited

U.S. PATENT DOCUMENTS

| 2010/0112732 A1* | 5/2010 | Lai et al. ................ 438/16 |
| 2011/0049604 A1 | 3/2011 | Nishihara |
| 2011/0049636 A1 | 3/2011 | Ooike |
| 2011/0241094 A1 | 10/2011 | Morikado |
| 2012/0106252 A1 | 5/2012 | Ozaki et al. |
| 2012/0211861 A1 | 8/2012 | Nishihara |

FOREIGN PATENT DOCUMENTS

| JP | 2011-49361 A | 3/2011 |
| JP | 2011-54658 A | 3/2011 |
| JP | 2011-211111 A | 10/2011 |
| JP | 2012-174982 A | 9/2012 |

* cited by examiner

*Primary Examiner* — Quoc Hoang

(74) *Attorney, Agent, or Firm* — Oblon, McClelland, Maier & Neustadt, L.L.P.

(57) ABSTRACT

A nonvolatile semiconductor storage device includes a substrate; an isolation film extending in a first direction and dividing the substrate into element regions; a cell string including memory cells in the element regions; a cell unit including the cell string and a select transistor on first directional ends of the cell string; diffusion layers formed in a portion of the element region first directionally beside the select gate electrode, the diffusion layers being adjacent to one another in a second direction intersecting with the first direction; and contacts extending through an interlayer insulating film and contacting the diffusion layers. An upper surface of the isolation film located between the diffusion layers is lower than an upper surface of the substrate. A laminate of silicon oxide film and a silicon nitride film are located above the upper surface of the isolation film and below the upper surface of the substrate.

8 Claims, 17 Drawing Sheets

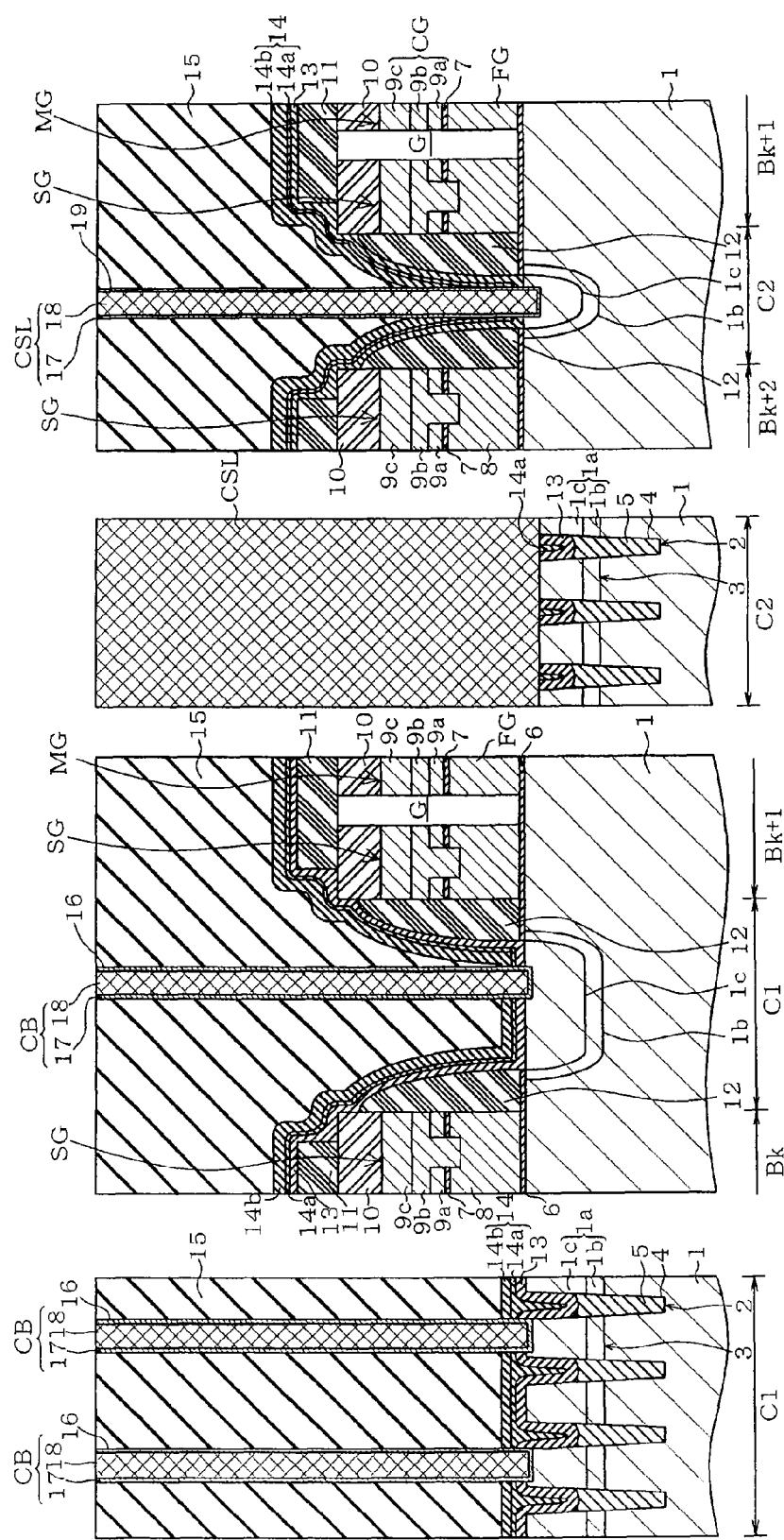

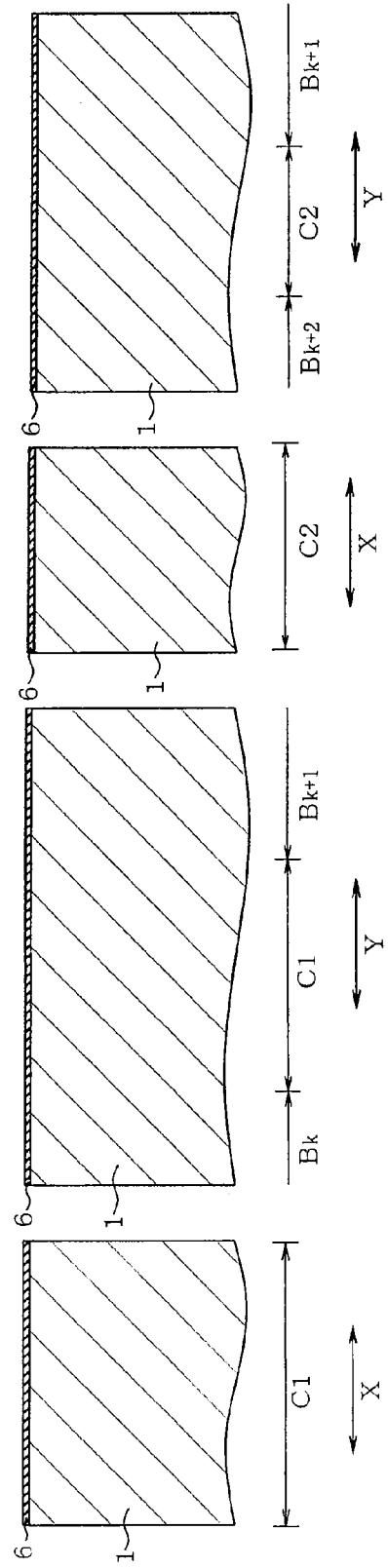

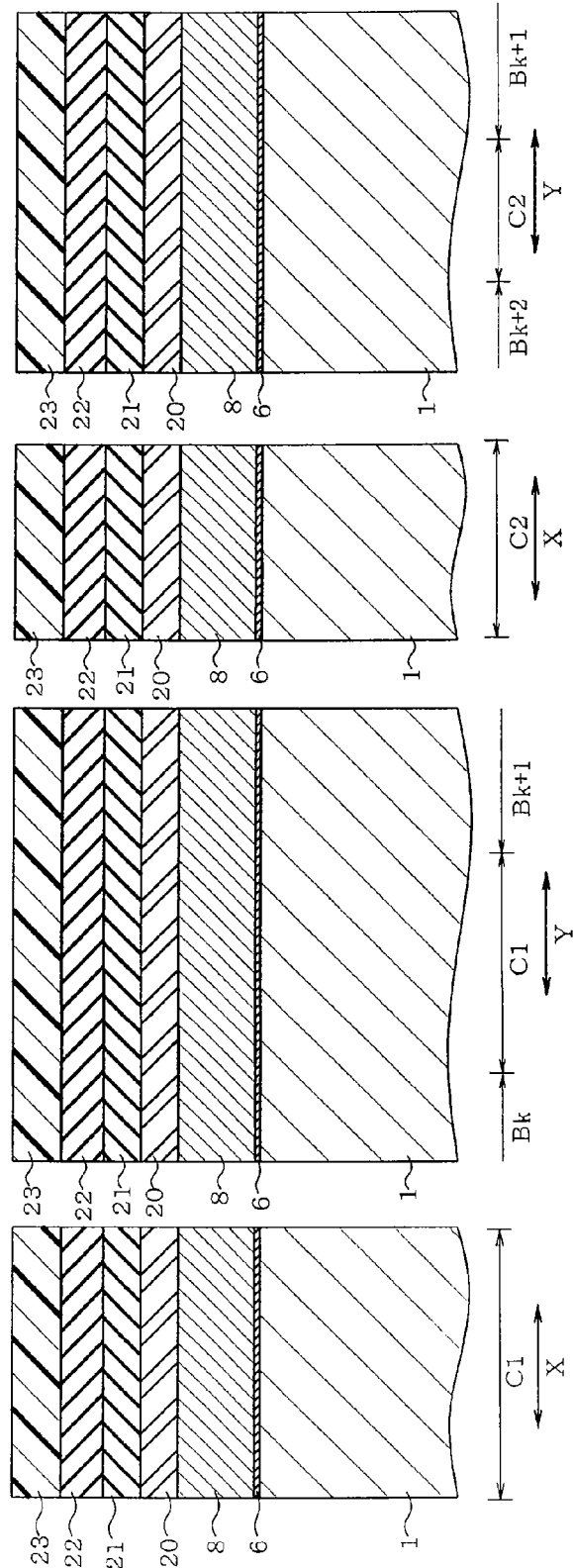

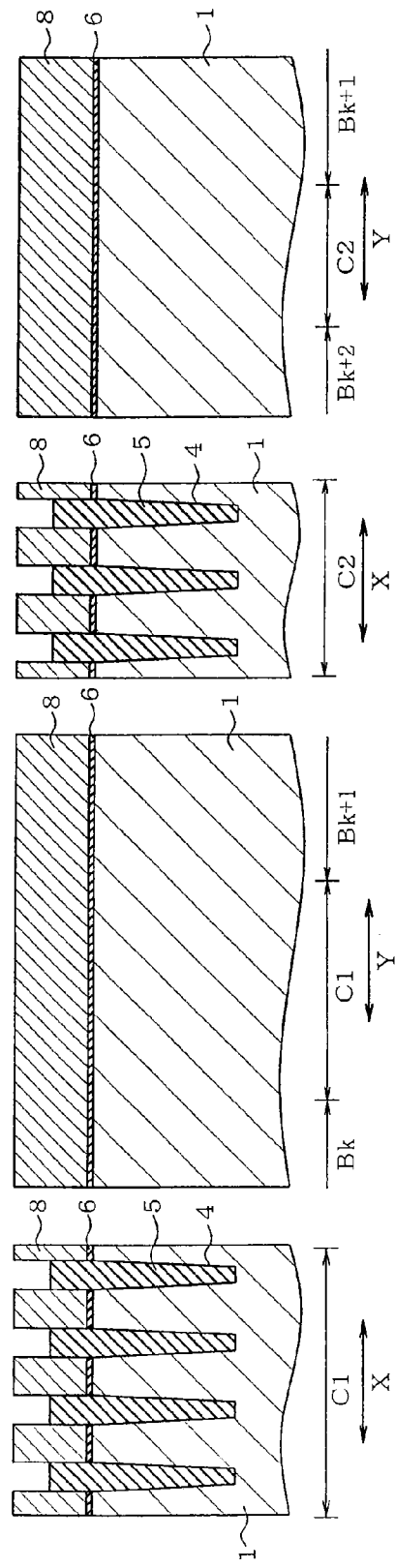

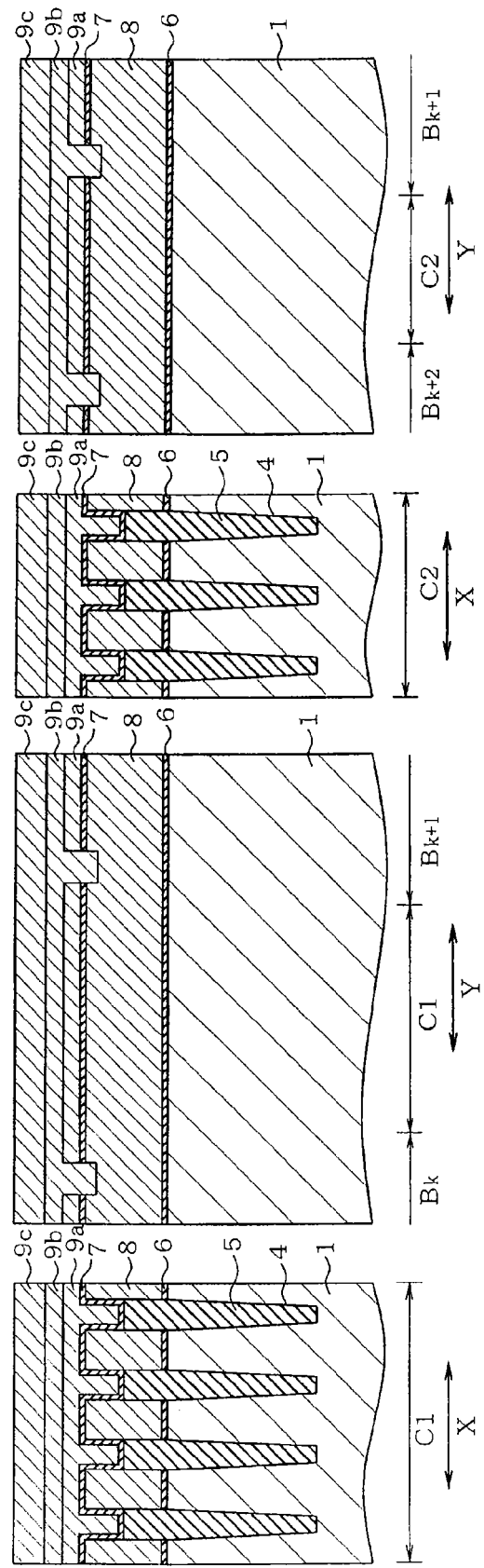

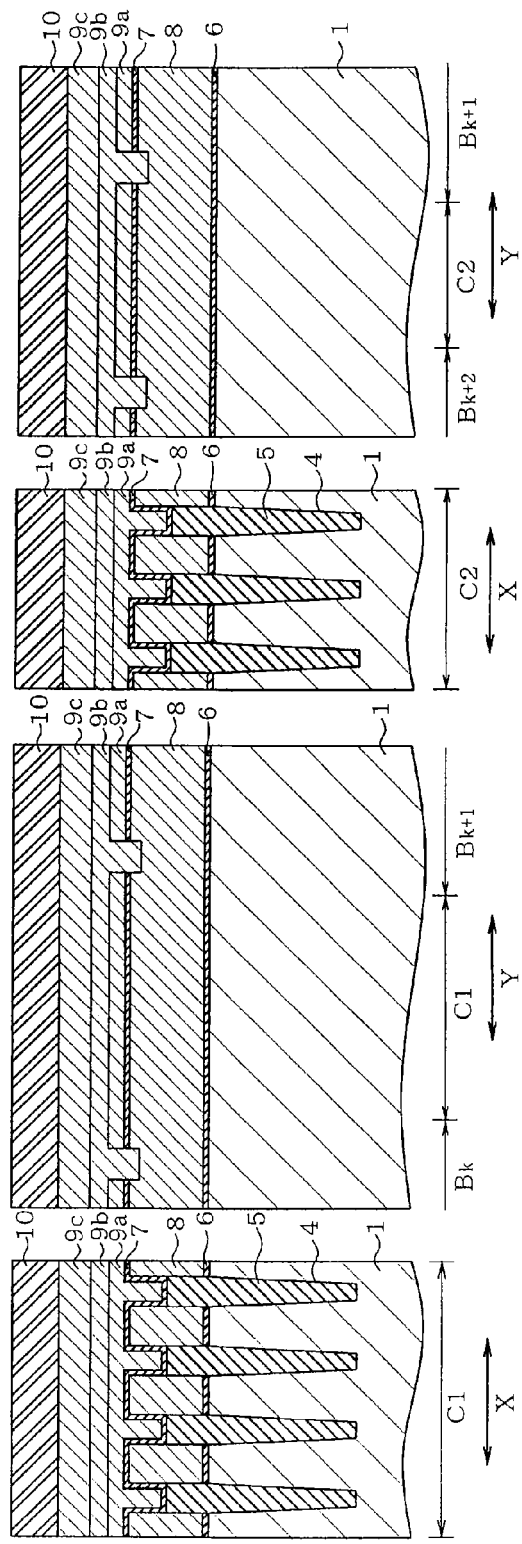

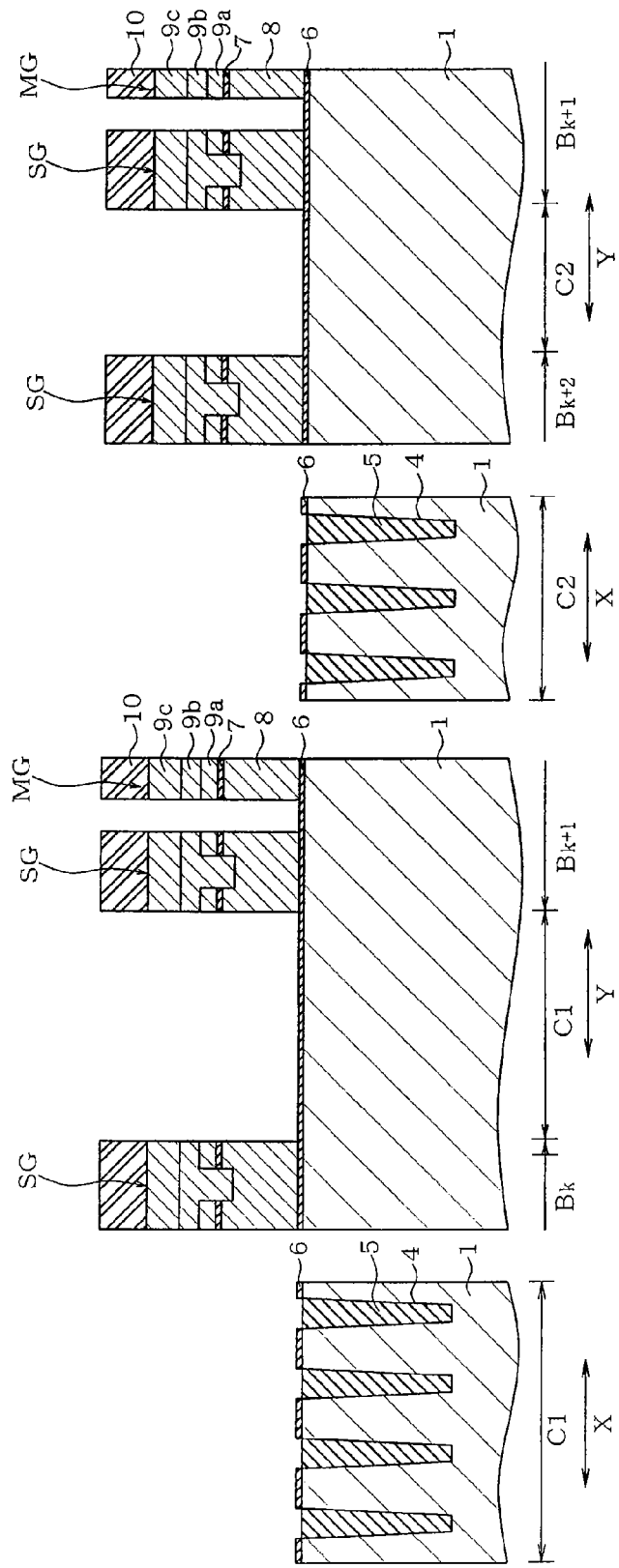

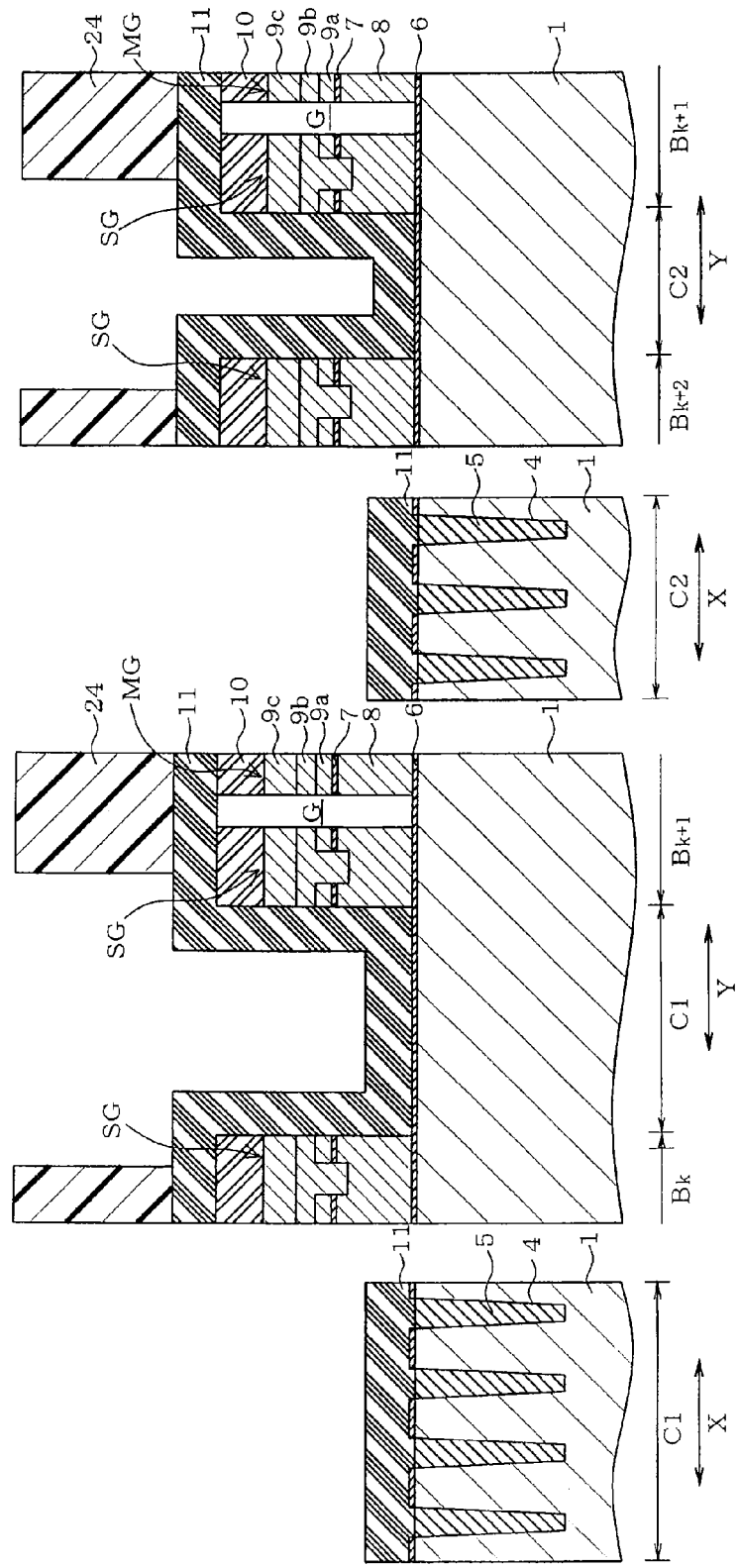

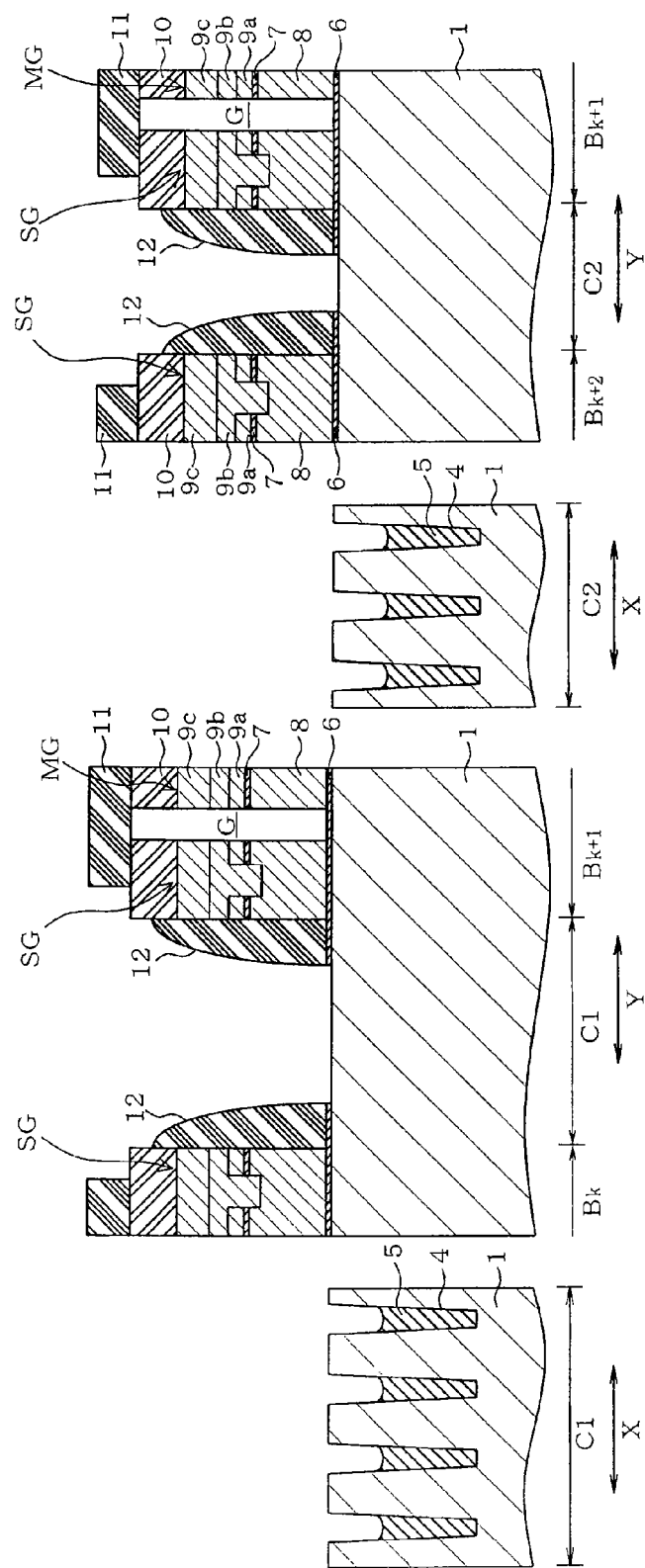

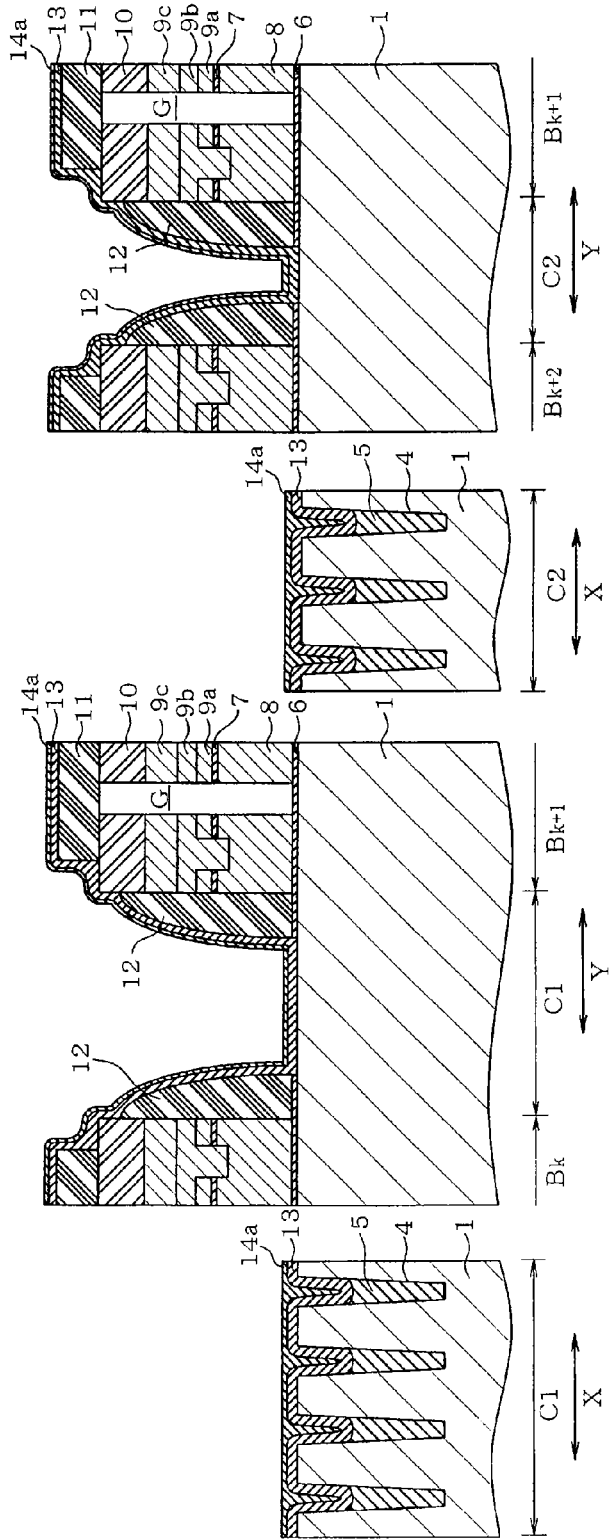

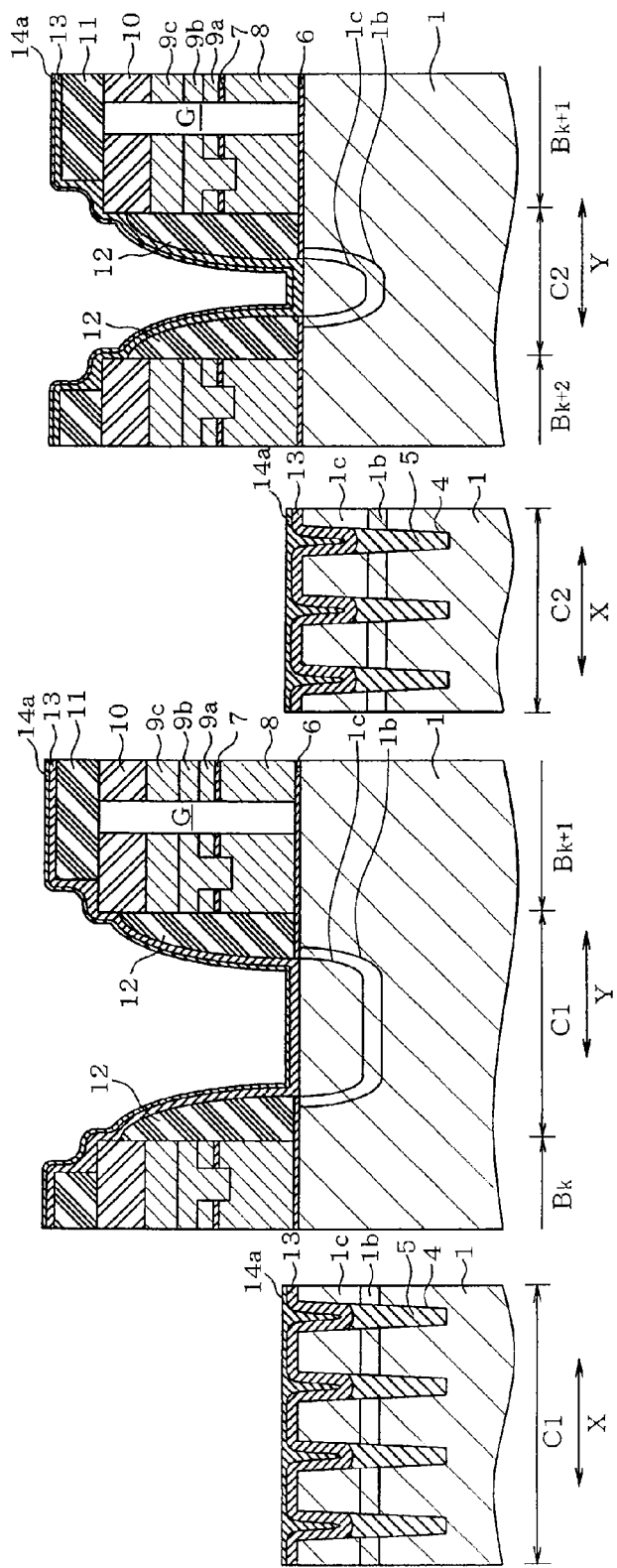

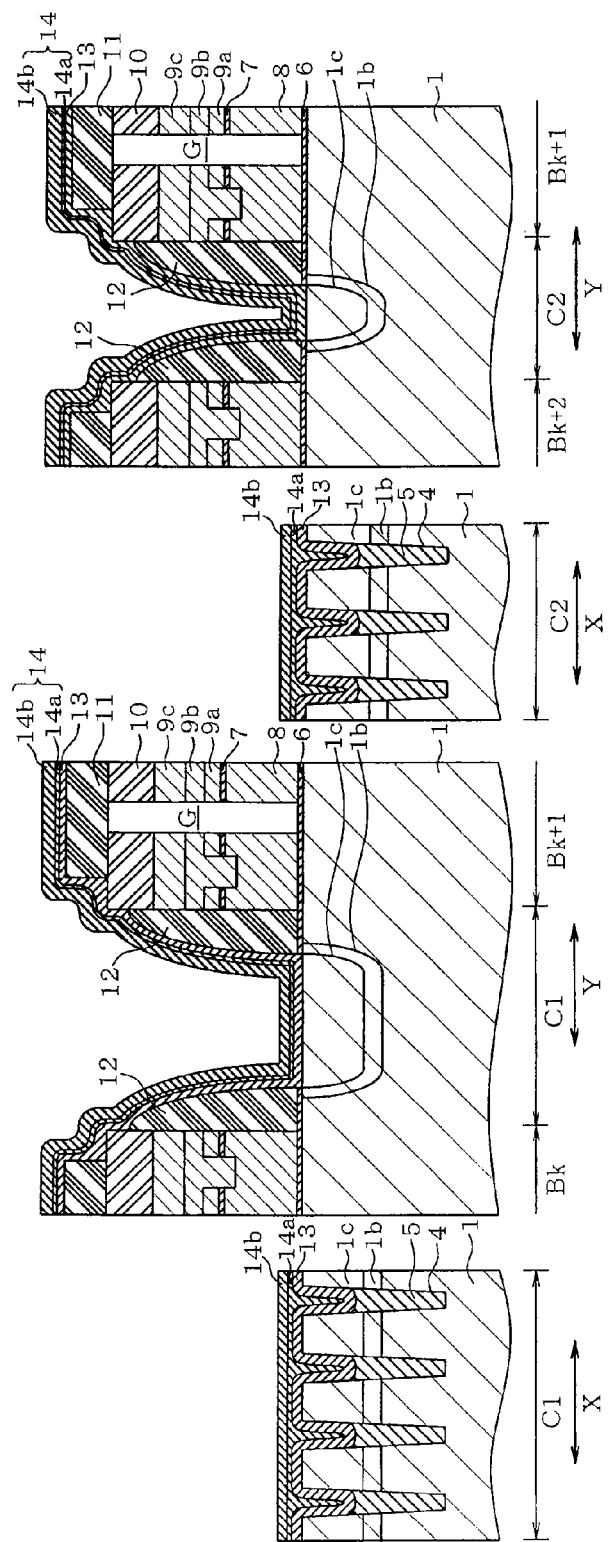

US 8,981,522 B2

NONVOLATILE SEMICONDUCTOR STORAGE DEVICE AND METHOD OF MANUFACTURING THE SAME

CROSS-REFERENCE TO RELATED APPLICATION(S)

This application is based upon and claims the benefit of priority from Japanese Patent Application No. 2013-006328, filed on, Jan. 17, 2013 the entire contents of which are incorporated herein by reference.

FIELD

Embodiments disclosed herein generally relate to a nonvolatile semiconductor storage device and a method of manufacturing the same.

BACKGROUND

Nonvolatile semiconductor storage devices such as a nonvolatile semiconductor memory typically have a contact region located between select gate electrodes which are used for selection of cell strings. In the contact region, an impurity diffusion layer is formed in order to reduce contact resistance. A contact is typically formed in an active layer also referred to as an element region which is formed by delineating a semiconductor substrate with element isolation trenches.

The doped impurities may, however, strain the semiconductor substrate and cause swelling of the element region hosting the diffusion layer. This may destroy the crystal structure of the semiconductor substrate and cause crystal defects. The crystal defects may lead to shorting of the cell strings which may cause performance degradations such as an increase in junction leakage current.

BRIEF DESCRIPTION OF THE DRAWINGS

FIG. 4A is one schematic example of a vertical cross sectional view taken along line 4A-4A of FIG. 2;

FIG. 4B is one schematic example of a vertical cross sectional view taken along line 4B-4B of FIG. 2;

FIG. 4C is one schematic example of a vertical cross sectional view taken along line 4C-4C of FIG. 2;

FIG. 4D is one schematic example of a vertical cross sectional view taken along line 4D-4D of FIG. 2;

FIGS. 5A, 6A, 7A, 8A, 9A, 10A, 11A, 12A, 13A, 14A, 15A, 16A, and 17A; FIGS. 5B, 6B, 7B, 8B, 9B, 10B, 11B, 12B, 13B, 14B, 15B, 16B, and 17B; FIGS. 5C, 6C, 7C, 8C, 9C, 10C, 11C, 12C, 13C, 14C, 15C, 16C, and 17C; and FIGS. 5D, 6D, 7D, 8D, 9D, 10D, 11D, 12D, 13D, 14D, 15D, 16D, and 17D each illustrate an example of one phase of a process flow for manufacturing the region corresponding to FIGS. 4A, 4B, 4C, and 4D, respectively.

DESCRIPTION

Figure 1:
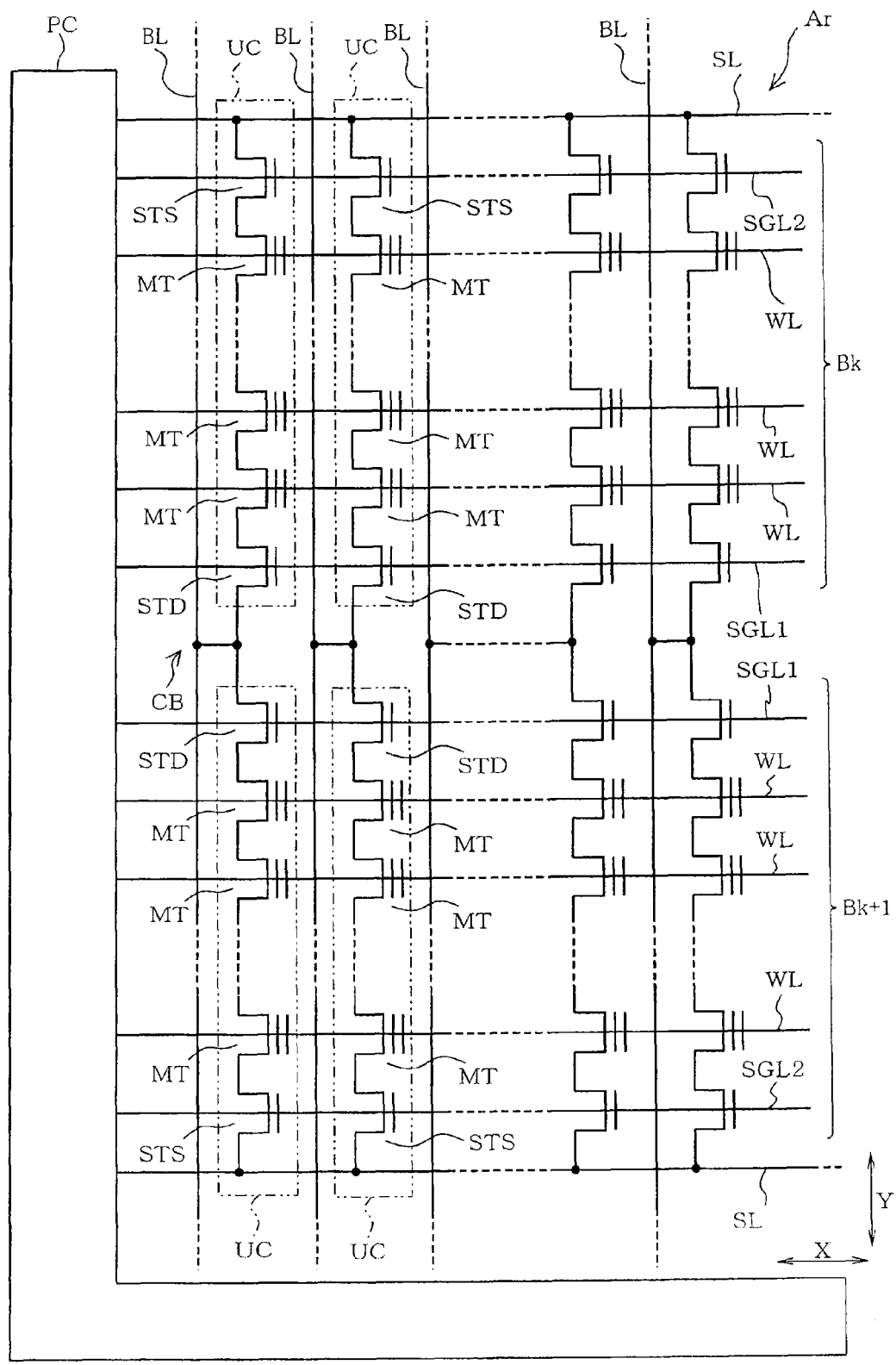
FIG. 1 illustrates one schematic example of an electrical configuration of a nonvolatile semiconductor storage device of one embodiment.

In one embodiment, a nonvolatile semiconductor storage device is disclosed. The device includes a semiconductor substrate; an element isolation film that extends in a first direction and that divides the semiconductor substrate into a plurality of element regions; a cell string including a plurality of memory cells disposed along the first direction in the element regions; a cell unit including the cell string and a select transistor located on ends of the cell string in the first direction; a plurality of diffusion layers each formed in a portion of the element region located beside the select gate electrode in the first direction, each of the diffusion layers being arranged to be adjacent to one another in a second direction intersecting with the first direction; an interlayer insulating film formed above the plurality of diffusion layers; and a plurality of contacts extending through the interlayer insulating film and contacting the diffusion layers respectively; wherein an upper surface the element isolation film located between the diffusion layers is lower than an upper surface of the semiconductor substrate; and wherein a silicon oxide film and a silicon nitride film disposed above the silicon oxide film are provided above the upper surface of the element isolation film and below the upper surface of the semiconductor substrate.

In one embodiment, a method of manufacturing a nonvolatile semiconductor device is disclosed. The method includes dividing a semiconductor substrate into a plurality of element regions by defining a plurality of trenches extending in a first direction into the semiconductor substrate so as to be aligned in a second direction intersecting with the first direction and filling the trenches with an element isolation film; exposing an upper surface of the element regions by lowering an upper surface of the element isolation film so as to be lower than an upper surface of the semiconductor substrate; forming a silicon oxide film along an upper surface and an upper sidewall of the element regions and along the upper surface of the element isolation film so as to form recesses on an upper side thereof; filling the recesses with the first silicon nitride film; forming a plurality of diffusion layers in a surface layer of the element regions after filling the recesses with the first silicon nitride film; forming a second silicon nitride film thicker than the first silicon nitride film above the first silicon nitride film; forming an interlayer insulating film above the second silicon nitride film; forming a plurality of holes through the interlayer insulating film using the second silicon nitride film as a stopper; extending the holes to expose each of the diffusion layers; and filling the holes with a contact.

One embodiment of a nonvolatile semiconductor storage device is described hereinafter through a NAND flash memory application with reference to FIGS. 1 to 17D.

In the following description, elements that are identical in structure and function are identified by identical reference symbols. The drawings are not drawn to scale and thus, do not reflect the actual measurements of the features such as the correlation of thickness to planar dimensions and the relative thickness of different layers. Further, directional terms such as up, upper, upward, down, lower, downward, left, leftward, right, and rightward are used in a relative context with an assumption that the worked surface of the later described semiconductor substrate faces up. Thus, the directional terms do not necessarily correspond to the directions based on gravitational acceleration.

FIG. 1 is one example of a block diagram providing an overview of the electrical configuration of the NAND flash memory. As shown in FIG. 1, NAND flash memory A is provided with memory cell array Ar and peripheral circuit PC. Memory cell array Ar comprises multiplicity of memory cells arranged in a matrix. Peripheral circuit PC reads/programs/erases each of the memory cells of memory cell array Ar.

Memory cell array Ar includes multiplicity of units of cells also referred to as cell unit UC. Cell unit UC comprises a $2^k$ number of series connected memory cell transistors MT, such as 64 in number, situated between a couple of select transistors STD and STS. Select transistor STD is connected to a bit line BL and select transistor STS is connected to a source line. Memory cell transistor MT is also hereinafter referred to as memory cell MT for simplicity. A dummy transistor may be provided between select transistor STD and memory cell MT and between select transistor STS and memory cell MT. Memory cells MT located between select transistors STD and STS constitute a cell string.

The X-direction aligned memory cells MT shown in FIG. 1 are interconnected by common word line WL extending in the X direction, whereas the X-direction aligned select transistors STD are interconnected by common select gate line SGL1 extending in the X direction and likewise, the X-direction aligned select transistors STS are interconnected by common select gate line SGL2 also extending in the X direction.

The drain of each select transistor STD located on one end of cell unit UC is coupled to bit line BL by way of bit line contact CB shown in FIG. 1. Bit line BL extends in the Y direction intersecting with the X direction shown in FIG. 1. The source of each select transistor STS in a given block is coupled to a common source line SL extending in the X-direction as viewed in FIG. 1.

Figure 2:
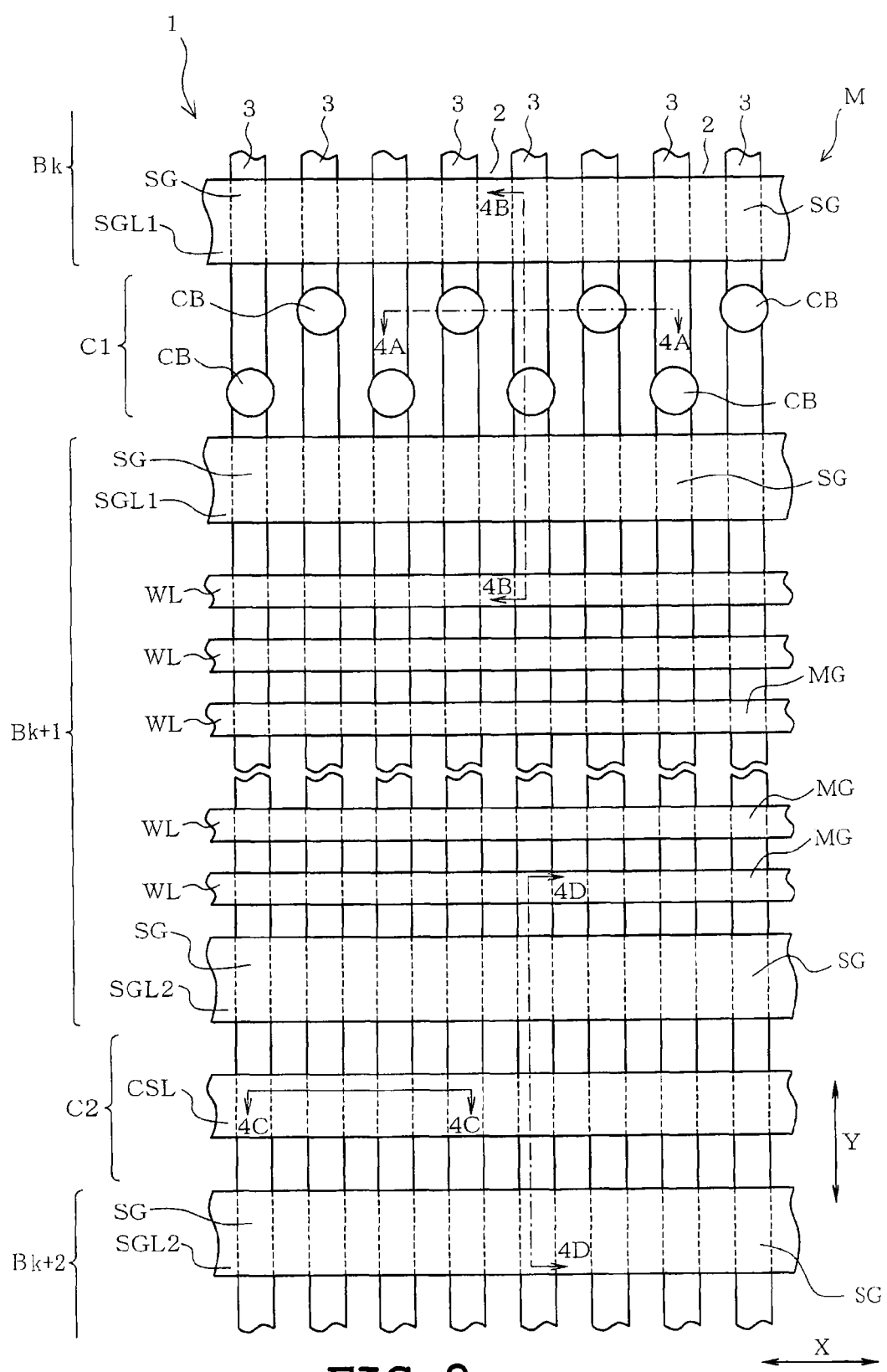
FIG. 2 partially illustrates one schematic example of a planar layout of a memory cell region according to one embodiment.
Figure 3:
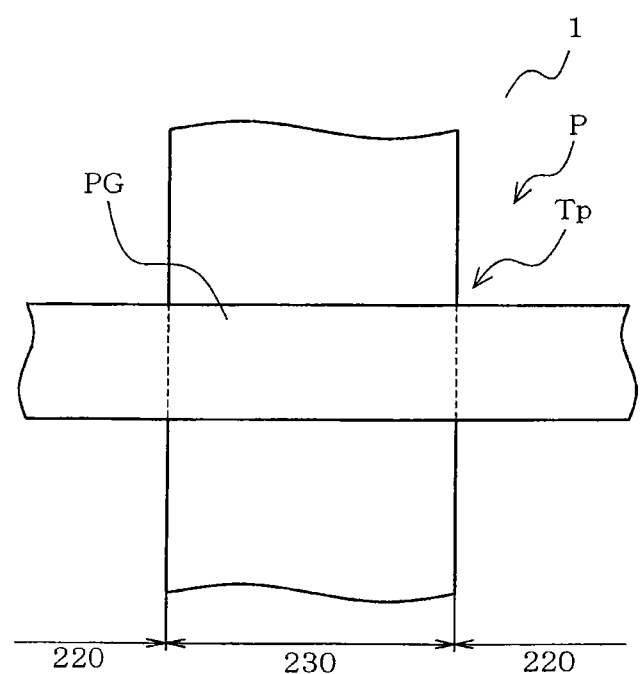
FIG. 3 partially illustrates one schematic example of a planar layout of a peripheral circuit region according to one embodiment.

FIG. 2 partially illustrates one example of a planar layout of a memory cell region. FIG. 3 partially illustrates one example of a planar layout of a peripheral circuit region. In memory cell ration M, multiplicity of element isolation regions 2 run in the Y direction of semiconductor substrate 1 as shown in FIG. 2. In one embodiment, semiconductor substrate 1 comprises a p-type monocrystal silicon substrate. Element isolation regions 2 are disposed so as to be separated from one another in the X direction as viewed in FIG. 2 to isolate element regions 3 by a predetermined space interval in the X direction. In one embodiment, the isolation employs a shallow trench isolation scheme known as STI.

As described earlier, select gate line SGL1 interconnecting select transistors STD extend along the X direction which is the direction in which word line WL extends. Between select gate lines SGL1 of Y-directionally adjacent blocks $B_k$ and $B_{k+1}$ as viewed in FIG. 2, region C1 is provided in which bit line contacts CB are formed. In each of element regions 3 located between a pair of select gate lines SGL1, bit line contact CB is formed. As also described earlier, select gate line SGL2 interconnecting select transistors STS extend along the X direction which is the direction in which word line WL extends.

Still referring to the plan view of memory cell region M shown in FIG. 2, gate electrode MG of memory cell MT is formed above element region 3 intersecting with word line WL. Select gate electrode SG of select transistor STD is formed above element region 3 intersecting with select gate line SGL1, whereas select gate electrode SG of select transistor STS is formed above element region 3 intersecting with select gate line SGL2.

In peripheral circuit region P shown in FIG. 3, element isolation region 220 employing an STI scheme is formed into semiconductor substrate 1 so as to isolate element regions 230. Gate electrode PG is formed so as to extend across element region 230.

In peripheral circuit region P, various types of transistors such as high level voltage transistors and low level voltage transistors are formed for driving memory cell transistors MT. Such transistors are configured by gate electrode PG and a drain/source region formed in the surface layer of element region 230 of semiconductor substrate 1 located beside gate electrode PG.

For the ease of explanation, the region between block $B_k$ and $B_{k+1}$ is referred to as contact region C1 and the region between $B_{k+1}$ and $B_{k+2}$ is referred to as contact region C2 as shown in FIG. 2.

Referring now to FIGS. 4A to 4D, description will be given on the structures of memory cell MT, select transistor STD, and contact regions C1 and C2 as well as their peripheral structures.

Referring to FIG. 4A, element isolation trenches 4 are formed into the surface layer of semiconductor substrate 1. The multiplicity of element isolation trenches 4 extend in the Y direction in which the bit line extends and are isolated from one another in the X direction in which the word line extends. Element isolation trenches 4 isolate element regions 3 in the word line direction. Element isolation trenches 4 are filled with element isolation film 5.

In one embodiment, element isolation film 5 comprises a liner oxide film and a coating-type oxide film though not distinguished by a boundary in the drawings. The liner oxide film is lined along the inner side of element isolation trench 4 and the coating-type oxide film is formed on the inner side of the liner oxide film. In contact region C1, silicon oxide film 13, silicon nitride film 14a, and silicon nitride film 14b are formed above element isolation film 5. The details of this structure will be later described. Element isolation film 5 of STI structure provides electric isolation between element regions 3.

Referring now to FIGS. 4B and 4D, gate electrode MG is formed above tunnel insulating film 6 located in element region 3 of semiconductor substrate 1. Gate electrode MG comprises floating electrode FG serving as a charge storing layer, intergate electrode insulating film 7, and control gate electrode CG stacked in the listed sequence. The charge storing layer may be replaced by an insulating film including charge traps or a laminate of such insulating film and an electrical conductor.

Tunnel insulating film 6 may comprises a silicon oxide film. Floating electrode FG may comprise polycrystalline silicon doped with impurities such as phosphorous (P). Interelectrode insulating film 7 may be configured based on an ONO film comprising a stack of oxide film/nitride film/oxide film. Control electrode CG may comprise polycrystalline silicon 9a and 9b doped with impurities such as phosphorous (P) and tungsten (W) film 9c formed above polycrystalline silicon 9a and 9b. Polycrystalline silicon 9a and 9b and tungsten film 9c extend in the X direction normal to the page as viewed in FIG. 4B and thus, serves locally as control gate CG and globally as word line WL.

Select gate electrode SG is substantially identical in structure to gate electrode MG but is provided with an opening extending through interelectrode insulating film 7 and polycrystalline silicon film 9a to allow polycrystalline silicon 9b to contact polycrystalline silicon film 8 through the opening.

Silicon nitride film 10 serving as a cap film is formed above each of gate electrode MG and SG. Between gate electrodes SG and MG, gaps G are formed. Gaps G may be formed between gate electrodes MG as well. Interlayer insulating film 11 partially covers the upper portion of gate electrode MG and select gate electrode SG. Interlayer insulating film 11 may comprise a silicon oxide film formed by an ordinary CVD (chemical vapor deposition) under conditions providing poor step coverage.

Referring to FIG. 4B, contact region C1 is located between select gate electrodes SG of adjacent blocks $B_k$ and $B_{k+1}$ as described earlier. As can be seen in FIG. 4B, spacer film 12 is formed along the opposing sidewalls of select gate electrodes SG.

In contact region C1, diffusion region 1a is formed which takes a DDD (Double Diffused Drain) structure as shown in FIG. 4A. Diffusion layer 1a is formed by introducing n-type impurities, for instance, phosphorous (P) or arsenic (As) into semiconductor substrate 1 and diffusing the impurities by thermal treatment. Diffusion layer 1a is not limited to a DDD structure but may be formed of arsenic (As).

Silicon oxide film 13 is formed along interlayer insulating film 11, partially along the upper surface and the upper sidewall of select gate electrode SG, along spacer film 12, and along the mid upper surface of contact region C1 of semiconductor substrate 1. Silicon oxide film 13 contacts the mid upper surface of contact region C1 located in semiconductor substrate 1.

Silicon nitride film 14 is further formed above silicon oxide film 13. Silicon nitride film 14 comprises a stack of relatively thin silicon nitride film 14a and silicon nitride film 14b thicker than silicon nitride film 14a. Silicon nitride film 14 may serves as a contact stopper during the formation of a contact hole which is later filled to form bit line contact CB.

Above silicon nitride film 14, interlayer insulating film 15 is filled which comprises a stack of a lower oxide film and an upper oxide film. The lower oxide film may comprise silicate glass possessing good gap fill capabilities such as BPSG (borophosphosilicate glass). Contact hole 16 extends through interlayer insulating film 15, silicon nitride film 14, and silicon oxide film 13 to reach the upper surface of semiconductor substrate 1. Contact hole 16 is filled with bit line contact CB.

Bit line contact CB extends through interlayer insulating film 15, silicon nitride film 14, and silicon oxide film 13 to contact diffusion layer 1c, containing highly concentrated impurities, located in the contact region C1. Bit line contact CB may include barrier metal film 17 formed along the inner side of contact hole 16 and tungsten film 18 filling contact hole 16 over barrier metal film 17.

As can be seen in FIGS. 2 and 4B, bit line contacts CB are arranged in a zigzag layout. Supposing that each of bit lines BL are uniquely and sequentially numbered, bit line contacts CB associated with even numbered bit lines BL are located relatively closer to select gate electrode SG of block $B_k$, whereas bit line contacts CB associated with odd numbered bit lines BL are located relatively closer to select gate electrode SG of block $B_{k+1}$.

FIG. 4A is a cross sectional view of contact region C1 and its peripheral structures taken along the word line direction. As can be seen in FIG. 4A, element isolation film 5 is filled in the lower portion of element isolation trenches 4 that isolate element regions 3. The upper surface of element isolation film 5 is located below the upper surface of diffusion layer 1a of semiconductor substrate 1. In other words, the upper surface of element region 3 of semiconductor substrate 1 protrudes upward relative to the upper surface of element isolation film 5 as viewed in FIG. 4A, and thus, the upper surface and the upper side-surface, i.e. upper sidewall of element region 3 is not covered by element isolation film 5. Element region 3 of contact region C1 and element isolation film 5 are lined by aforementioned silicon oxide film 13, silicon nitride films 14a and 14b, and interlayer insulating film 15 in the listed sequence.

Figures 13A, 13B, 13C, 13D:
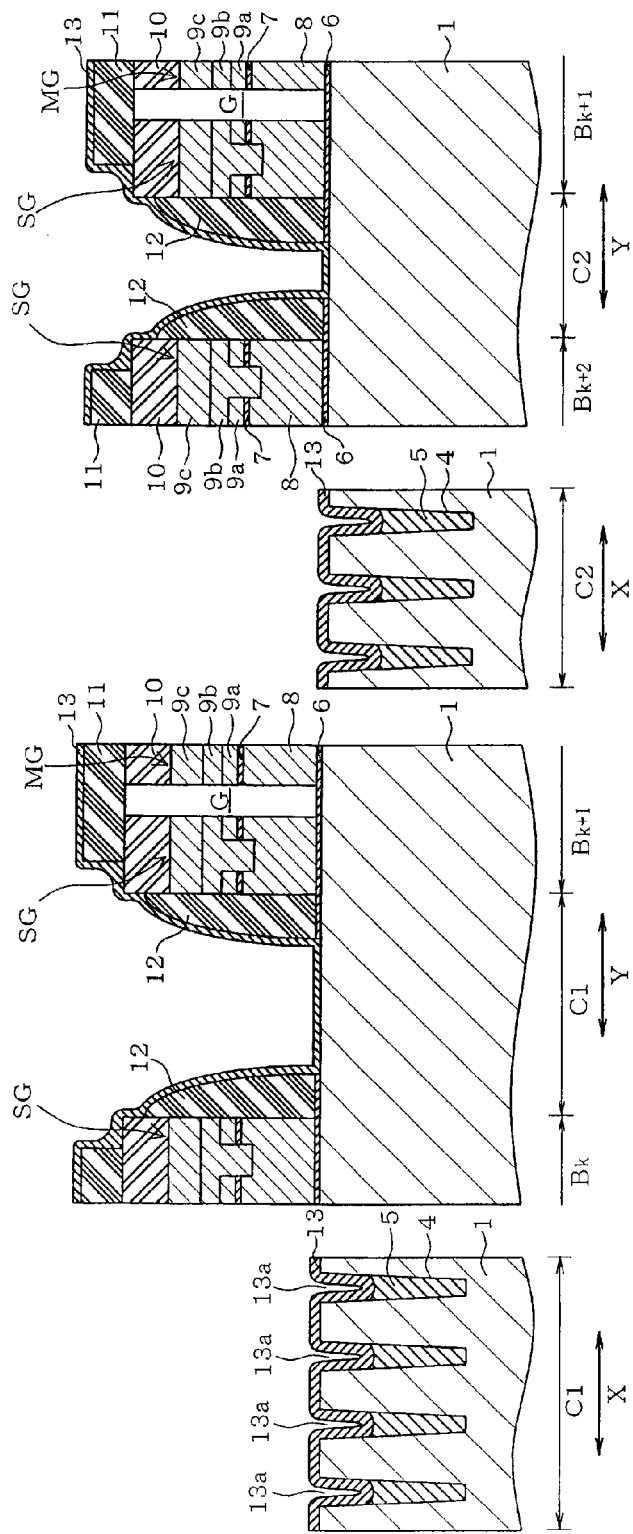
Figures 17A, 17B, 17C, 17D:
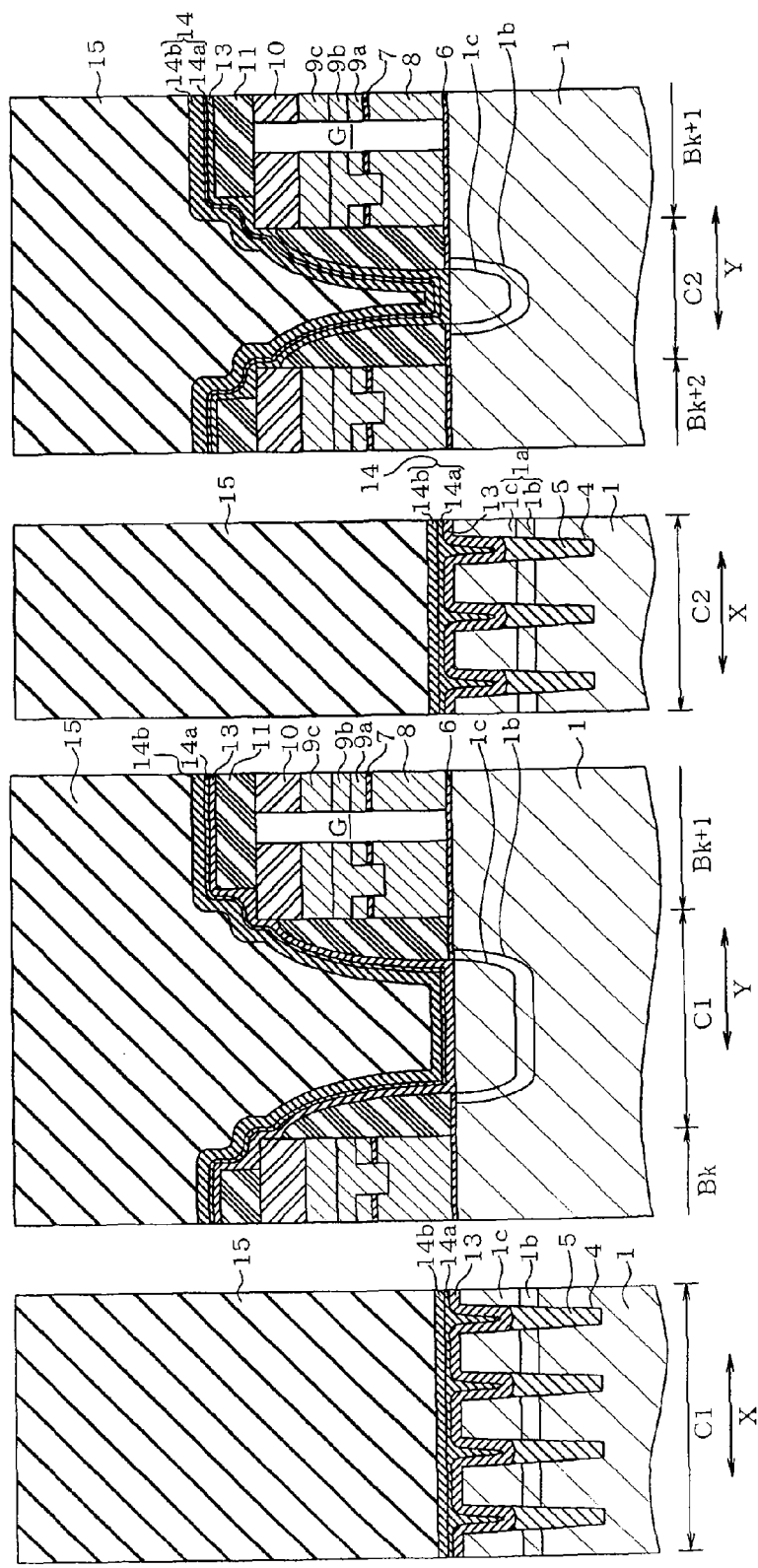

As well shown in FIG. 4A, silicon oxide film 13 is formed along the upper surface and upper sidewall of element region 3 as well as along the upper surface of element isolation film 5 so as to follow the topography of the underlying structure. As a result, silicon oxide film 13 located in element isolation region 2 defines recesses 13a as can be seen in FIG. 13A. Recesses 13a are filled with silicon nitride film 14 such that silicon nitride film 14 interposes the adjacent element regions 3.

Diffusion layer 1a formed in the surface layer of semiconductor substrate 1 takes a DDD structure as described earlier. Diffusion layer 1a includes an outer diffusion layer 1b, lightly doped impurities, and an inner diffusion layer 1c, heavily doped with impurities. N-type dopants such as phosphorous (P) or arsenic (As) are introduced by ion implantation performed twice to form diffusion layers 1b and 1c respectively. Diffusion layer 1a is formed in element regions 3 located on the Y-directional sides of the select transistors so as to be X-directionally adjacent to diffusion layer 1a formed in the adjacent element regions 3.

The inventors have found that the upper portion of element region 3 swells in the X direction in which the word line extends when said upper portion is upwardly protrusive relative to the upper surface of element isolation film 5. Thus, in one embodiment, silicon nitride film 14 is filled in recesses 13a located above element isolation film 5 and between the adjacent element regions 3. It is possible to suppress the swelling of a portion near the element region 3 to which bit line contact CB contacts and as a result, it is possible to prevent shorting.

As shown in FIGS. 4C and 4D, source line contact CSL is formed in a similar manner in contact region C2 located on source line SL side. In contact region C2 and its peripheral regions, etching for forming trench 19 into the surface layer of semiconductor substrate 1 progresses faster than the etching for forming contact hole 16 of bit line contact CB.

Thus, silicon oxide film 13 and silicon nitride films 14a and 14b above the upper surface of element region 3 are removed as shown in FIG. 4C. Above the upper surface of element isolation film 5 located on the word-line directional sides of element region 3, silicon oxide film 13 and silicon nitride film 14a are formed. Trench 19 provided for forming source line contact CSL is configured to be deeper than contact hole 16 for forming bit line contact CB. This means that the bottom surface of source line contact CSL is lower in elevation compared to the bottom surface of bit line contact CB.

<Manufacturing Method>

Next, a description will be given on one example of a manufacturing process flow of a nonvolatile semiconductor storage device. FIGS. 5A to 17A suffixed by "A" each illustrate an example of one phase of a process flow for manufacturing the region corresponding to FIG. 4A. Similarly, FIGS. 5B to 17B, 5C to 17C, and 5D to 17D each illustrate an example of one phase of a process flow for manufacturing the region corresponding to FIGS. 4A, 4B, 4C, and 4D, respectively. The following descriptions will focus on the features according to one embodiment and thus, known steps may be added or removed from the process flow as required. Further, the sequence of the process flow may be rearranged if practicable.

Referring to FIG. 5A to 5D, tunnel insulating film 6 comprising a silicon oxide film is formed above semiconductor substrate 1 by thermal oxidation.

Referring to FIG. 6A and 6B, silicon film 8 is deposited by CVD (Chemical Vapor Deposition) which is followed by deposition of silicon nitride film 20 serving as a mask, and silicon oxide film 21 and silicon film 22 serving as a hard mask in the listed sequence. Resist 23 is further coated over silicon film 22.

Next, a brief description will be given on process flow for obtaining the structure shown in FIGS. 7A to 7D. Resist 23 is patterned by photolithography and anisotropic etching is performed by RIE (Reactive Ion Etching). After removing resist 23, the films underlying resist 23 are used as masks to form element isolation trench 4 into tunnel insulating film 6, silicon film 8, and semiconductor substrate 1. In one embodiment, element isolation trench 4 may be formed in a width beyond lithographic limit by employing double patterning techniques such as a sidewall transfer method.

The inner surface of element isolation trench 4 is lined by an oxide film not shown by CVD which is followed by coating of polysilazane solution into the lined trench. Thermal treatment is subsequently performed to convert polysilazane into a silicon oxide film to thereby obtain element isolation film 5.

Then, after planarizing element isolation film 5 using silicon nitride film 20 as a stopper, elevation of the upper surface of element isolation film 5 is arranged to be higher than the upper surface of semiconductor substrate 1 and lower than the upper surface of silicon film 8 by RIE as shown in FIG. 7A. Next, silicon nitride film 20 is removed by wet etching using hot phosphoric acid to obtain the structure illustrated in FIGS. 7A to 7D.

Referring to FIGS. 8A to 8D, interelectrode insulating film 7 comprising an ONO (Oxide-Nitride-Oxide) film is deposited by CVD which is followed by deposition of a thin silicon film 9a. Then, a resist not shown is coated over silicon film 9a and patterned. Using the patterned resist as a mask, silicon film 9a and interelectrode insulating film 7 are etched whereafter the resist pattern is removed. Next, silicon (Si) is deposited to form silicon film 9b, followed by deposition of tungsten (W) to form tungsten film 9c. Silicon films 9a and 9b which are initially amorphous are eventually transformed into polysilicon films as they go through thermal treatment performed later in the manufacturing process flow.

Referring now to FIGS. 9A to 9D, silicon nitride film 10, serving as a mask, is formed above tungsten film 9c by CVD.

Silicon oxide film and silicon film, neither of which are shown, are further deposited in the listed sequence by CVD which is followed by formation and patterning of a resist not shown above the foregoing laminate. Using these films as masks one after another, tungsten film 9c, silicon films 9b and 9a, interelectrode insulating film 7, and silicon film 8 are anisotropically etched by RIE as shown in FIGS. 10A to 10D. Gate structures of memory cell gate electrode MG and select gate electrode SG are obtained by the foregoing process flow.

As can be seen in FIGS. 10A and 10C, the upper surface of semiconductor substrate 1 and the upper surface of element isolation film 5 are controlled to be substantially level in contact regions C1, C2 and their peripheral regions. The leveling of the upper surfaces of semiconductor substrate 1 and element isolation film 5 need not be achieved at this timing but may be achieved in other timings.

As shown in FIGS. 11A to 11D, interlayer insulating film 11 comprising a silicon oxide film is deposited by plasma CVD under conditions providing poor step coverage, whereafter a photoresist is formed and subsequently patterned into resist pattern 24 by lithography.

Using resist pattern 24 as a mask, interlayer insulating film 11, tunnel insulating film 6, and semiconductor substrate 1 located between select gate electrodes SG are etched by RIE as shown in FIGS. 12A to 12D. As the result of etching, interlayer insulating film 11 remains as spacer film 12 along the opposing sidewalls of select gate electrodes SG of adjacent blocks $B_k$, and $B_{k+1}$. In addition to the foregoing films, the upper surface of element isolation film 5 is also subjected to etching thereby lowering the upper surface of element isolation film 5 below the upper surface of semiconductor substrate 1. Thus, the upper portion of element regions 3 in contact regions C1 and C2 are exposed, meaning that gaps are created between the X-directionally adjacent element isolation regions 3 in contact regions C1 and C2. Resist pattern 24 is thereafter removed.

Referring now to FIGS. 13A to 13D, silicon oxide film 13 is deposited by CVD. Silicon oxide film 13 is formed along the inner surface of element isolation trench 4. The thickness of silicon oxide film 13 is controlled so as not to completely fill the gaps between the X-directionally adjacent element regions 3. As a result, silicon oxide film 13 overlying element isolation film 5 forms recesses 13a as can be seen in FIGS. 13A and 13C.

Referring to FIGS. 14A to 14D, a thin silicon nitride film 14a is deposited for example, by CVD. The thickness and deposition recipe of silicon nitride film 14 is controlled to a level to fill recesses 13a. As a result, recesses 13a formed by silicon oxide film 13 is filled with silicon nitride film 14a in contact regions C1, C2, and their peripheral regions as shown in FIGS. 14A and 14C.

Referring to FIGS. 15A to 15D, n-type impurities are doped in 2 iterations by ion implantation into the source/drain located between select gate electrodes SG and in the region for forming n-channel transistors in peripheral circuit PC to form an impurity doped layer comprising layers of different concentrations namely low-concentration impurity doped layer and high-concentration impurity doped layer.

Further, though not shown, p-type impurities are doped in 2 iterations into in the region for forming p-channel transistors in peripheral circuit PC. The dopant is thereafter activated, for instance, by RTA (Rapid Thermal Anealing) in a nitrogen atmosphere of 900° C. to 1050° C. to obtain impurity diffusion layers 1b and 1c taking a DDD (Double Diffused Drain) structure.

Referring now to FIGS. 16A to 16D, silicon nitride film 14b is deposited by CVD. Silicon nitride film 14b serves as a contact stopper and thus, is formed thicker than silicon nitride film 14a. The contact stopper serves a stopper when forming contact hole 16 for forming bit line contact CB and trench 19 for forming source line contact CSL.

Referring to FIGS. 17A to 17D, interlayer insulating film 15 made of materials such as a silicon oxide film is deposited by CVD.

Above interlayer insulating film 15, a resist not shown is formed and patterned so as to serve as a mask for forming contact hole 16 through interlayer insulating film 15 by RIE using silicon nitride film 14b as a stopper. Silicon nitride film 14a may be used as an additional stopper to support silicon nitride film 14b. Trench 19 for forming source contact CSL is also formed at the same time.

When forming contact hole 16 and trench 19, etching progressing through interlayer insulating film 15 is temporarily stopped on silicon nitride film 14. After modifying the etch recipe, etching is restarted to progress through the insulating film below silicon nitride film 14 until reaching the upper surface of semiconductor substrate 1 to form contact hole 16 and trench 19. The resist pattern is thereafter removed.

Because the etch rate is greater in trench 19 than in contact hole 16 and, elevation of the bottom of trench 19 is lower than the bottom of hole 16. Silicon nitride film 14a may be removed when forming trench 19.

Next, barrier metal film 17 is formed in contact hole 16 and trench 19 and tungsten film 18 is further deposited in contact hole 16 and trench 19 by CVD, whereafter overflow of tungsten film 18 of barrier metal 17 is polished by CMP (Chemical Mechanical Polishing). This is followed by formation of multi-layer interconnect structure which is not described in detail.

Notably, the upper surface of semiconductor substrate 1 located between select gate electrodes SG of adjacent blocks $B_k$ and $B_{k+1}$ protrudes above the upper surface of element isolation film 5 as shown in FIGS. 12A and 12C as the result of gate isolation process of gate electrodes MG and SG shown in FIGS. 10A to 10D and spacer film 12 processing shown in FIGS. 12A to 12D.

It was found that in the subsequent dopant implantation illustrated in FIGS. 15A to 15D, significant amount of crystal defects were observed in the surface layer of semiconductor substrate 1 when n-type dopant was introduced by ion implantation at high acceleration and high dose and thereafter activated by thermal treatment performed at 900° C. to 1050° C. It was further found that significant amount of crystal defects were observed when materials of heavy mass such as arsenic (AS) was used as an n-type dopant.

According to the foregoing process flow, after forming interlayer insulating film 11 into spacer 12 as shown in FIGS. 12A to 12D, silicon oxide film 13 is formed along the upper surface and the upper side-surface of semiconductor substrate 1 as shown in FIG. 13A and silicon nitride film 14a is filled in recess 13a formed by silicon oxide film 13. This allows silicon oxide film 14a to be filled in a portion of element isolation trench 4 of semiconductor substrate 1 located beside element region 3.

Such structure prevents the swelling of element region 3 even when the dopant is introduced at high acceleration and high speed and subjected to thermal treatment of high temperature ranging from 900° C. to 1050° C. in order to form high-concentration impurity region 1c in semiconductor substrate 1 located between select gate electrodes SG for establishing connection with a contact.

When element region 3 swells in the X direction in which the word line extends, bit line contact CB may come in contact with an unintended element regions 3 which it is not supposed to contact. Adopting the above described process flow will prevent such risks. Thus, shorting originating from bit line contact CB contacting unintended element regions 3 can be prevented.

Further, formation of silicon oxide film 13 between element region 3 and silicon nitride film 14 in contact region C1 reduces leakage current between the X-directionally adjacent element regions 3 through charge traps of silicon nitride film 14. Silicon nitride film 14a is filled in a portion of element isolation trench 4 of semiconductor substrate 1 located beside element region 3. The bottom surface of each diffusion layer 1a is lower in elevation compared to the upper surface of element isolation film 5. However, when misalignment occurs between bit line contact CB and element region 3, bit line contact CB may penetrate through diffusion layer 1a.

Contact region C1 has silicon nitride film 14a formed between element regions 3 in addition to silicon oxide film 13. Because silicon nitride film 14a is filled in recesses 13a, thick silicon nitride film 14a is formed above element isolation film 5. This means that silicon nitride film 14a functions more effectively as a stopper. As a result, silicon nitride film 14a residing beside element region 3 prevents bit line contact CB from penetrating through diffusion layer 1a even if bit line contact CB is misaligned.

Other Embodiments

The above described embodiments may be modified as follows. Silicon nitride films (SiN) 14a and 14b may be replaced by silicon carbonitride film (SiCN). Any insulating film including silicon (Si) and nitrogen (N) may be employed alternatively.

Embodiments directed to a single bit memory cell MT and multi-bit memory cell MT both fall within the scope of the application.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor storage device, comprising:
   a semiconductor substrate;
   an element isolation film that extends in a first direction and that divides the semiconductor substrate into a plurality of element regions;
   a cell string including a plurality of memory cells disposed along the first direction in the element regions;
   a cell unit including the cell string and a select transistor located on each of ends of the cell string in the first direction;
   a plurality of diffusion layers each formed in a portion of the element region located beside the select gate electrode in the first direction, each of the diffusion layers being arranged to be adjacent to one another in a second direction intersecting with the first direction;
   an interlayer insulating film formed above the plurality of diffusion layers; and
   a plurality of contacts extending through the interlayer insulating film and contacting the diffusion layers respectively;
   wherein an upper surface the element isolation film located between the diffusion layers is lower than an upper surface of the semiconductor substrate; and
   wherein a silicon oxide film and a silicon nitride film disposed above the silicon oxide film are provided above the upper surface of the element isolation film and below the upper surface of the semiconductor substrate.

2. The device according to claim 1, wherein a bottom surface of each of the diffusion layers is lower than the upper surface of the element isolation film.

3. The device according to claim 1, wherein the silicon oxide film forms a recess between the adjacent diffusion layers, and wherein the silicon nitride film includes a first silicon nitride film formed along an inner side of the recess and a second silicon nitride film formed above the first silicon nitride film.

4. The device according to claim 3, wherein the second silicon nitride film is thicker than the first silicon nitride film.

5. The device according to claim 3, wherein the first silicon nitride film contains carbon.

6. The device according to claim 3, wherein the second silicon nitride film contains carbon.

7. The device according to claim 1, wherein the semiconductor substrate is a silicon substrate, and wherein each of the diffusion layers contains arsenic.

8. The device according to claim 1, wherein the contact includes a bottom surface which is higher than the lowermost surface of the first silicon nitride film.

* * * * *